United States Patent [19]

Hibbs-Brenner

[11] Patent Number: 5,475,701

[45] Date of Patent: Dec. 12, 1995

[54] INTEGRATED LASER POWER MONITOR

[75] Inventor: Mary K. Hibbs-Brenner, Bloomington, Minn.

[73] Assignee: Honeywell Inc., Minneapolis, Minn.

[21] Appl. No.: 175,016

[22] Filed: Dec. 29, 1993

[51] Int. Cl.[6] ...................................................... H01S 3/19
[52] U.S. Cl. .................................................................. 372/50
[58] Field of Search ........................................ 372/50, 45, 46

[56] References Cited

U.S. PATENT DOCUMENTS

| | | | |
|---|---|---|---|
| 5,136,603 | 8/1992 | Hasnain et al. | 372/50 |
| 5,238,466 | 2/1994 | Tabatabaie | 372/50 |
| 5,331,658 | 7/1994 | Shieh et al. | 372/50 |

*Primary Examiner*—Rodney B. Bovernick
*Assistant Examiner*—Robert E. Wise
*Attorney, Agent, or Firm*—John G. Shudy, Jr.

[57] ABSTRACT

A vertical cavity surface emitting laser source having an integrated power monitor at the non-emitting end of the source.

6 Claims, 6 Drawing Sheets

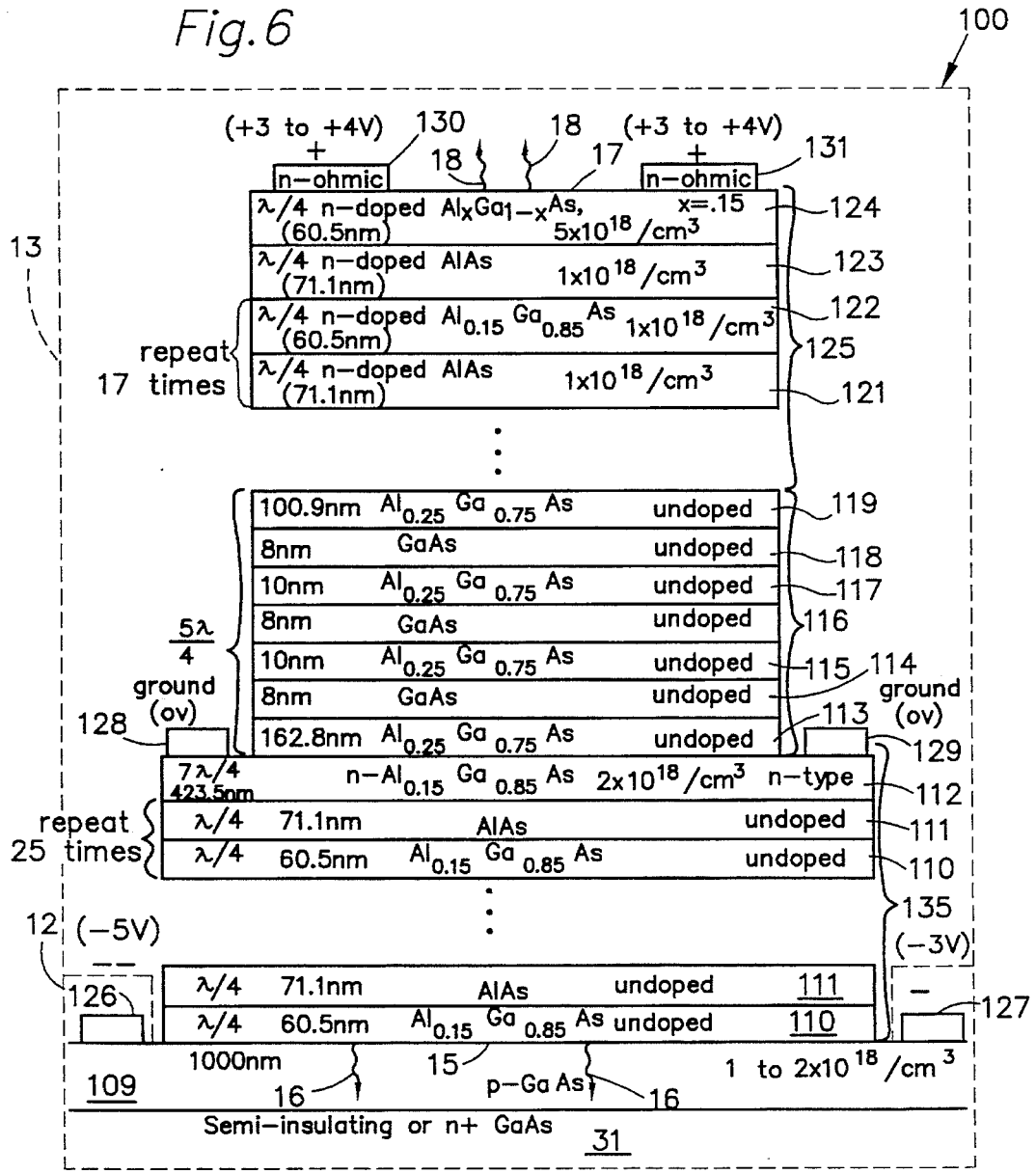

5,475,701

INTEGRATED LASER POWER MONITOR

BACKGROUND OF THE INVENTION

The present invention pertains to power monitors and particularly to laser source power monitors.

Vertical cavity surface emitting lasers in fiber optic communications require a feedback circuit so that the output power of the laser in the on-state can be maintained at a constant level during ambient temperature changes or the aging of the device incorporating the laser. In order to monitor the output power of the laser, some fraction of the output of the laser must be directed to a sensing device such as a photo detector. The output of this photo detector or sensing device is sent to a control circuit which adjusts the current driving the laser until the desired output power is achieved. For a vertical cavity surface emitting laser, a beam splitter may be placed at the output of the laser, which would direct some of the light to a photo detector, permitting the rest of the light to be directed into the optic fiber. However, this approach reduces the amount of light which can be coupled into the optic fiber. This reduction of light being coupled into the optic fiber affects the power margin or requires that the output of the laser and the associated power dissipation be higher than it would otherwise need to be. This power monitoring approach increases packaging complexity of such laser source.

SUMMARY OF THE INVENTION

The present invention eliminates the unnecessary reduction of power in the vertical cavity surface emitting laser (VCSEL) for purposes of output power monitoring. The invention has a photo detector integrated in the laser which detects the output power from light that would otherwise be lost.

In contrast, the related art has shown an integrated VCSEL having a photo detector wherein the absorbing detector layer is placed on the side of a laser where most of the light is emitted. While such configuration is easier to implement, it has the negative effect of reducing the power output of the laser.

BRIEF DESCRIPTION OF THE DRAWING

FIG. 6 is a cross sectional view of laser emitting at 850 nanometers with an integrated power monitor having a photo conducting detector with the junction flipped over.

DESCRIPTION OF THE EMBODIMENTS

Figure 1:
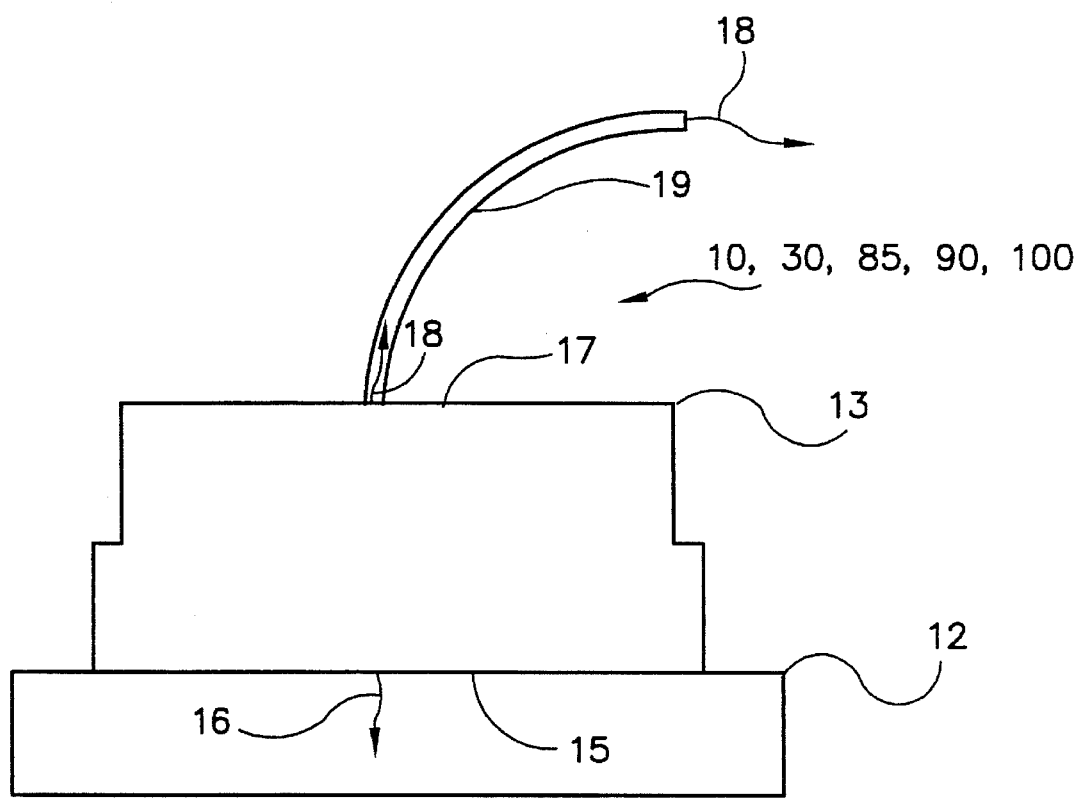
FIG. 1 shows a basic configuration of the invention.

FIG. 1 shows a photo detector 12 monolithically integrated on the bottom side 15 of a vertical cavity surface emitting laser (VCSEL) 13. Laser 13 is normally designed such that 10 to 20 percent of the emitted light comes out back side 15 and is lost. The providing of a photo detector 12 on back side 15 of laser 13 uses this light 16 which would otherwise be lost. Thus, photo detector 12 has no effect on the amount of light 18 emitted from top side 17 of laser 13 which is coupled into and conveyed by optic fiber 19.

Figure 2:
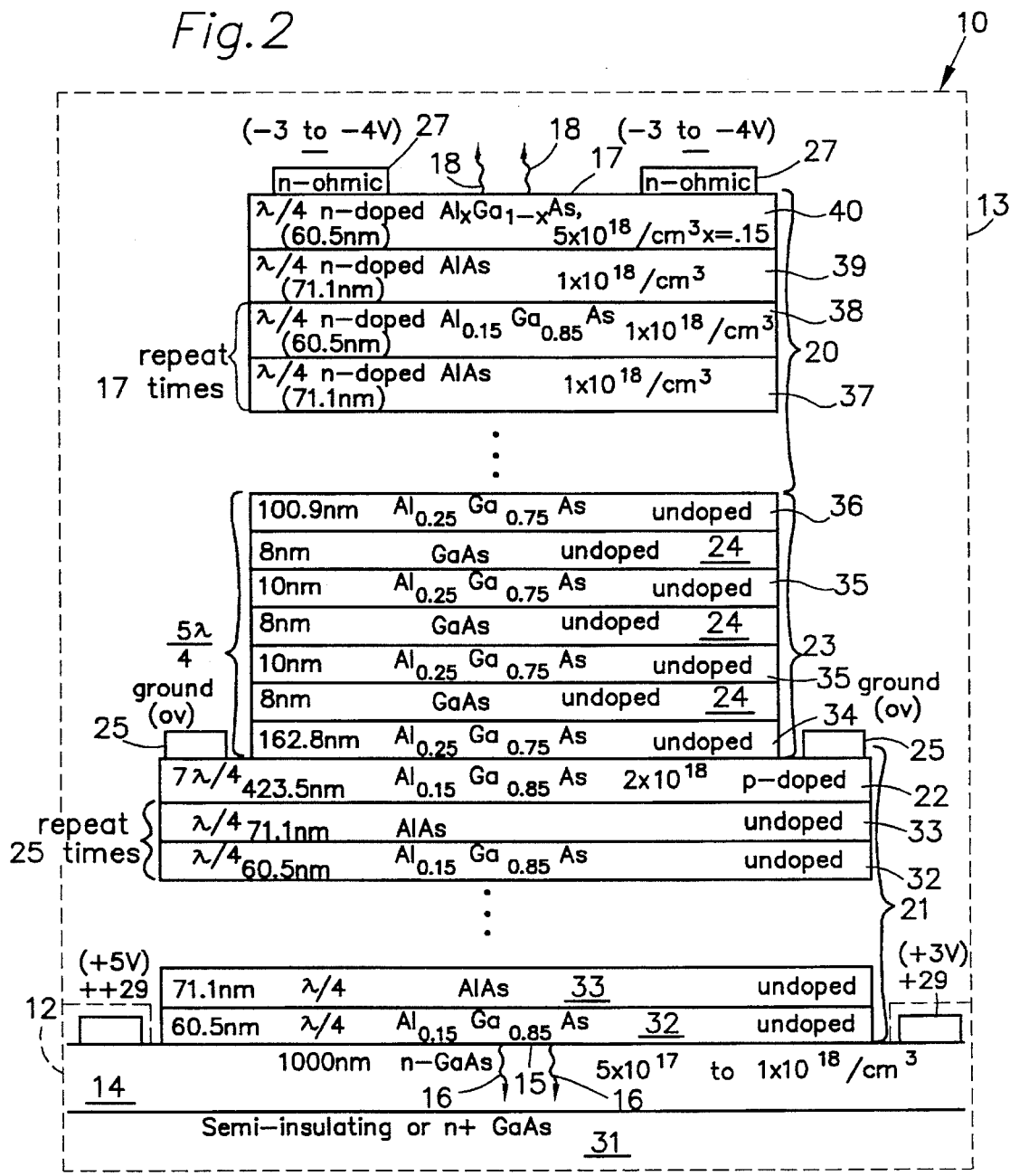
FIG. 2 is a cross sectional view of laser emitting at 850 nanometers with an integrated power monitor having a photo conducting detector.

FIG. 2 reveals an embodiment of the invention having integrated laser and photo detector 10. An n-doped photo detector layer 14 is grown first, followed by the forming of an undoped bottom laser mirror 21, a p-type AlGaAs contact layer 22, an undoped active layer 23 having three quantum well layers 24 which are eight nanometers thick and each are separated by AlGaAs barrier layers 35, and then a top mirror 20 which is a doped n-type.

Device 13 is fabricated by forming n-ohmic contacts 27 on top surface 17, then etching down to the p-type AlGaAs contact layer 22 and depositing p-ohmic contacts 25. At this stage, contacts 25 and 27 required for operating the laser are present. Next a second etching step is performed to reach n-type GaAs layer 14 for photo detector 12, and n-ohmic contacts 26 and 29 are deposited at this layer 14. To operate device 10, top ohmic contacts 27 on surface 17 of top mirror 20 are held at a negative bias, while p-ohmic contacts 25 are held at a ground or reference voltage so laser 13 is forward-biased.

In the mode of operation, photo detector 12 is used as a photo conductor. In this mode, one of n-ohmic contacts, 26, is held at a positive bias voltage, while an even more positive biased voltage would be applied to the other n-ohmic contact 29. A p-i-n junction between the positively biased n-type detector layer 14 and p-layer 22 of laser 13 would be reverse biased, so a minimum current would flow. Photons which are incident on photo detector layer 14 and are absorbed are converted to a current which is collected by metal contacts 26 and 29.

For photo detector 12, about 1000 nanometers of n-doped GaAs 14 is formed on a semi-insulating or n+doped GaAs substrate 31. The doping level of layer 14 is from $5\times10^{17}$ to $1\times10^{18}$ atoms per cm$^3$. Situated on layer 14 is 60.5 nanometers of undoped $Al_{0.15}Ga_{0.85}As$ material 32. On layer 32 is situated a 71.1 nanometer undoped AlAs layer 33. Layers 32 and 33 are λ/4 thick for a wavelength of 850 nanometers. λ/4 means the wavelength of the source divided by four and the refractive index of the layer. Layers 32 and 33 are repeated 25 times on top of each other. This compilation of 26 pairs of layers 32 and 33 plus a layer 22 is stack 21. On top of these layers is formed 423.5 nanometers of $Al_{0.15}Ga_{0.85}As$ of layer 22 and is part of stack 21. Layer 22 is p-doped at $2\times10^{18}$ atoms per cm$^3$. On top of layer 22 is layer 34 which is 162.8 nm of undoped $Al_{0.25}Ga_{0.75}As$. On layer 34 is first layer 24 of eight nanometers of undoped GaAs layer. On layer 24 is 10 nanometers of $Al_{0.25}Ga_{0.75}As$ of undoped material 35. Situated on layer 35 is another second layer 24 of eight nanometers undoped GaAs. On layer 24 is undoped $Al_{0.25}Ga_{0.75}As$ material layer 35. Situated on layer 35 is another third layer 24 of eight nanometers of undoped GaAs material. On that layer 24 is layer 36 of 100.9 nanometers of undoped $Al_{0.25}Ga_{0.75}As$ material. Layers 24, 34, 35, and 36 form stack 23 which has a thickness of 5λ/4.

5λ/4=$\Sigma_i$ (layer$_i$ thickness•refractive index$_i$). Situated on stack 23 is stack 20. Of stack 20, situated on layer 36 is layer 37 of 71.1 nanometers of n-doped AlAs having doping level of $1\times10^{18}$ atoms per cm$^3$. Formed on layer 37, is layer 38 of λ/4 n-doped $Al_{0.15}Ga_{0.85}As$ material at a doping level of $1\times10^{18}$ atoms per cm$^3$. Layer 38 is 60.5 nanometers thick. The pair of layers 37 and 38 are repeated 17 times to form at least a part of stack 20. Layer 39 is of the same thickness and composition of layer 37 and is formed on latter layer 38. Formed on layer 39 is layer 40 of 60.5 nanometers or a quarter wavelength of n-doped $Al_xGa_{x-1}As$ material where x= 0.15 and the doping level is $1\times10^{19}$ atoms per $cm^3$. Pairs of layers 37 and 38 plus layers 39 and 40 constitute stack 20. After the stacks 20 and 23 are completed they are etched as a mesa down to layer 22. Stack 21, including layer 22, is itself etched down at a wider width as a mesa on layer 14. On layer 14 outside the mesa of stack 21, n-ohmic contact 29 is formed on layer 14 on one side of the mesa and n-ohmic contact 26 is formed on the other side of the mesa of stack 21. On layer 22, having the mesa constituted by stacks 20 and 23, is a p-ohmic contact 25 placed at one side of that mesa and p-ohmic contact 25 placed at the other side of the mesa. On layer 40 on surface 17 a pair of n-ohmic contacts 27 are formed. For functioning of device 10, a potential of −3 to −4 volts is applied to contacts 27, the ground or a zero-reference voltage is applied to contacts 25, a +3 volts is applied to contact 26 and a +5 volts is applied to contact 29.

The fabrication process is as follows. The single crystal epitaxial layers required for the laser 13 and photo detector 12 structure may be grown by MBE (Molecular Beam Epitaxy) or OMVPE (Organo-Metallic Vapor Phase Epitaxy). The composition is graded at the interfaces between layers of different composition in order to reduce the resistance through the mirrors.

After epitaxial growth is complete, a mesa of stack 20 is etched down to p-contact layer 22 by using photolithography to pattern the wafer surface, and etching the exposed surfaces using chlorine-gas based reactive ion etching. The etching produces vertical sidewalls which provide the optical confinement to the device. The sample is then patterned a second time using photoresist to delineate the regions where contacts 25 are to lie. A p-ohmic metal contact 25 is deposited, with the bottom layer of the contact metal consisting of gold and zinc to provide a low resistance contact. A chemical liftoff process removes the metal from unwanted regions. The sample is once again patterned using photoresist, such that the first mesa and each ohmic contact 25 are protected. Again, the exposed region is etched using the chlorine-based reactive ion etching to reach the bottom detector layer 14. Here, n-ohmic contacts 26 and 25 are deposited using the liftoff process described above.

The sample is then planarized by spinning on a self-leveling polymer layer to cover the mesa, and then etching back this polymer to reveal the top surface of the mesa. The n-ohmic contacts 26 and 29 are then patterned and lifted off as described above. Another photolithography step may be used to connect the ohmic metals to a bond pad some distance from the device. An annealing step is required to form low resistance ohmic contacts.

Figure 3:
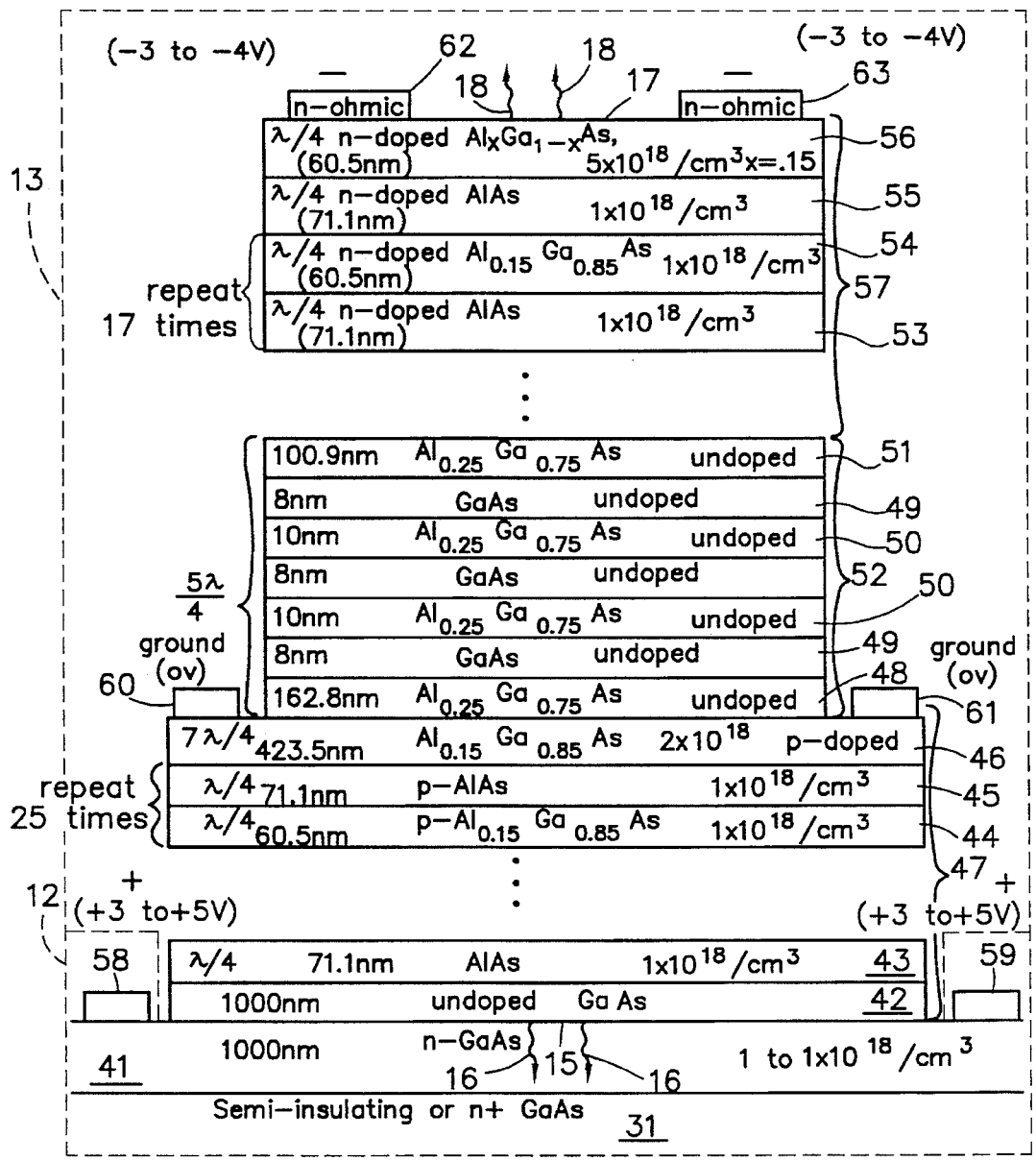
FIG. 3 is a cross sectional view of laser emitting at 850 nanometers with an integrated power monitor having a p-i-n detector.

FIG. 3 shows a device 30 which is configured as a VCSEL combined with a p-i-n photo detector 12. In this configuration, bottom mirror layers 47 are doped p-type, and an extra GaAs layer 42, which can be a very lightly doped n-type, is inserted between p-type mirror layers 44 and 45 and n-type GaAs layer 41 (to which contacts 58 and 59 are made). Both n-ohmic contacts to photo detector 12 on side 15 are at the same positive bias voltage so that a reverse biased p-n junction is formed and undoped or lightly doped n-layer 42 is the absorbing layer of photo detector 12. Laser 13 of FIG. 3 emits light at approximately 850 nanometers from top surface 17 of layer 56. Other compositions, thicknesses and doping concentrations in devices 12 and 13 of FIGS. 2 and 3 may vary.

For device 30 in FIG. 3, on semi-insulating n+GaAs substrate 31 is formed layer 41 having 1000 nanometers of n-doped GaAs material having a doping level of $1–2\times10^{18}$ atoms per $cm^3$. On layer 41 is formed a 1000 nanometers of undoped GaAs material as layer 42. On layer 42 is a layer 43 having a 71.1 nanometers of AlAs having a doping level $1\times10^{18}$ atoms per $cm^3$. This layer 43 has a thickness of $\lambda/4$ times refractive index of the AlAs at a wavelength of 850 nanometers. Situated on layer 43 is a quarter wavelength (i.e., 60.5 nanometers) of p-doped $Al_{0.15}Ga_{0.85}As$ material having a doping level of $1\times10^{18}$ atoms per $cm^3$, as layer 44. The pair of layers 43 and 44 are repeated about 25 times. Situated on top of the lastly formed layer 44 is layer 45 having a 71.1 nanometer thickness or $\lambda/4$ thickness of p-doped AlAs material having a doping level of $1\times10^{18}$ atoms per $cm^3$. Situated on layer 45 is a $7\lambda/4$ or 423.5 nanometer thickness of $Al_{0.15}Ga_{0.85}As$ p-doped at a level of $2\times10^{18}$ atoms per $cm^3$ as layer 46. Layers 42, pairs of layers 43 and 44, layer 45 and layer 46 constitute stack 47. On layer 46 is formed 162.8 nanometers of undoped $Al_{0.25}Ga_{0.75}As$ as layer 48. Another layer 49 of 8 nanometers on undoped GaAs is formed on layer 48. On layer 49 is formed another layer 50 of 10 nanometers of undoped $Al_{0.25}Ga_{0.75}As$ material. On layer 50 is formed another layer 49 of 8 nanometers of undoped GaAs material. On layer 49 is formed another layer 50 of 10 nanometers of undoped $Al_{0.25}Ga_{0.75}As$ material. On layer 50 is formed another layer 49 of 8 nanometers of undoped GaAs material. On layer 49 is layer 51 of 100.9 nanometers of undoped $Al_{0.25}Ga_{0.75}As$ material. Layers 48, 49, 50 and 51 make up stack 52 which has a thickness of $5\lambda/4$ which is equal to $\Sigma_i$(layer$_i$ thickness●refractive index$_i$). Formed on layer 51 is layer 53 which is 71.1 nanometers ($\lambda/4$) of n-doped AlAs having a concentration of doping at $1\times10^{18}$ atoms per $cm^3$. Formed on layer 53 is layer 54 which is 60.5 nanometers ($\lambda/4$) of n-doped $Al_{0.15}Ga_{0.85}As$ having a doping concentration of $1\times10^{18}$ atoms per $cm^3$. Layers 53 and 54 are repeated about 17 times on stack 52. On top layer 54 is layer 55 which is 71.1 nanometers ($\lambda/4$) of n-doped AlAs having a doping concentration of $1\times10^{18}$ atoms per $cm^3$. Situated on layer 55 is layer 56 having a thickness of 60.5 nanometers ($\lambda/4$) of n-doped $Al_{0.15}Ga_{0.85}As$ having a doping concentration of $>1\times10^{19}$ atoms per $cm^3$. The pairs of layers 53 and 54, and layers 55 and 56 constitute stack 57. Stacks 57 and 52 are etched into a mesa situated on layer 46 and stack 47 is etched down as a mesa situated on layer 41. On each side of stack 47 on layer 41 n-ohmic contacts 58 and 59 are formed. On layer 46 on both sides of the mesa constituting stacks 57 and 52, p-ohmic contacts 60 and 61 are formed. On the top surface 17 of layer 56 n-ohmics 62 and 63 are formed. For the functioning of photo detector 12 and laser 13, a voltage of +3 to +5 volts is applied to contacts 58 and 59. A ground or reference voltage of zero volts is applied to contacts 60 and 61 and a minus voltage of 3–4 volts is applied to contact 62 and 63.

Figure 4:
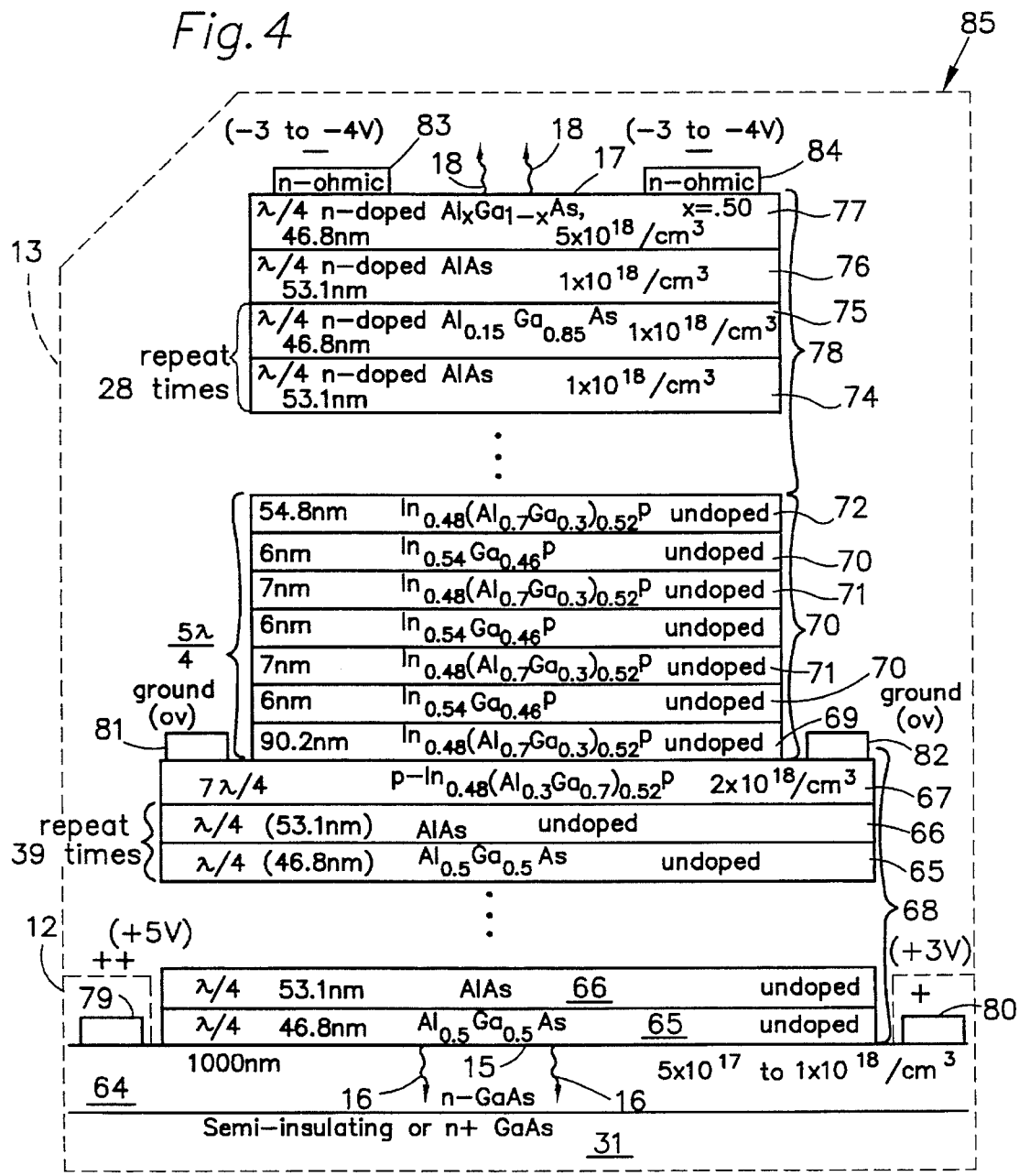
FIG. 4 is a cross sectional view of laser emitting at 650 nanometers with an integrated power monitor having a photo conducting detector.

InGaAlP/InGaP materials may be utilized to construct a VCSEL which emits light at 650 nanometers, as shown in FIG. 4. This device 85 uses a GaAs photo detector layer 64 on the bottom or back side 15, and a contact scheme is used to achieve the result of an integrated photo detector 12.

Figure 5:
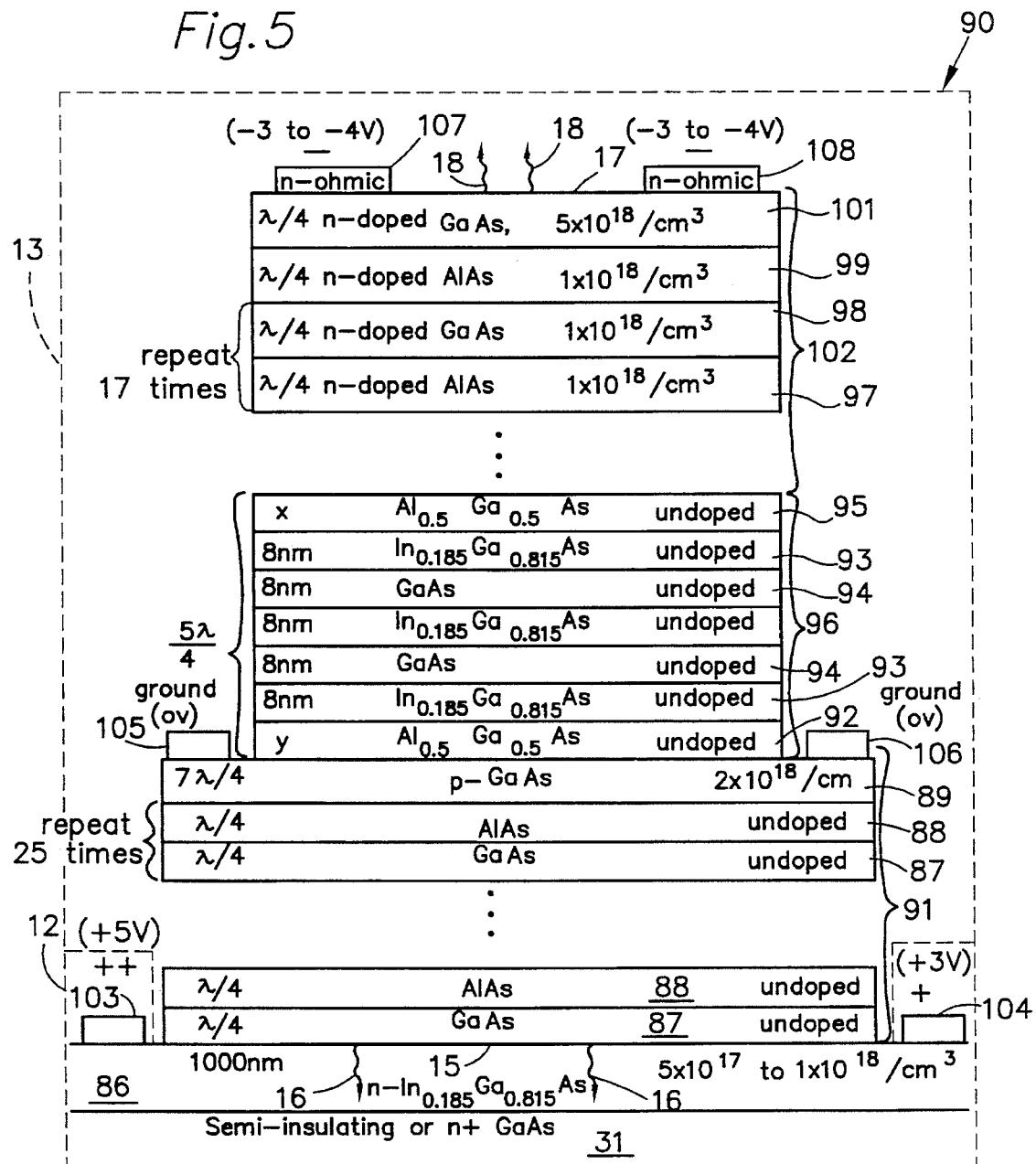
FIG. 5 is a cross sectional view of laser emitting at 980 nanometers with an integrated power monitor having a photo conducting detector.

VCSEL's emitting light at 650–980 nanometers may be fabricated from InGaAs/AlGaAs/InGaAlP materials as noted in FIGS. 4, 5 and 6. Such devices 85, 90 and 100 can be designed to emit most of the light from either the top or the bottom surface of wafer of laser 13. Device 13 may be turned upside-down, with a p-type mirror 125 at the top, and intracavity n-type contacts 128 and 129, and a p-type photo detector layer 109 as shown in FIG. 6.

FIG. 4 shows a laser 13 emitting at 650 nanometers with a photo conducting detector 12. Detector 12 is formed with a layer of 1000 nanometers of n-doped GaAs having a doping concentration from $5 \times 10^{17}$ to $1 \times 10^{18}$ atoms per cm$^3$. Formed on layer 64 is layer 65 having a thickness of 46.8 nanometers ($\lambda/4$) of undoped $Al_{0.5}Ga_{0.5}As$ material. Formed on layer 65 is layer 66 having a thickness of 53.1 nanometers ($\lambda/4$) of undoped AlAs material. This pair of layers 65 and 66 is repeated 39 times. Situated on the top layer 66 after repeating of these layers is layer 67 which is p-doped $In_{0.48}(Al_{0.3}Ga_{0.7})_{0.52}P$ having a doping concentration of $2 \times 10^{18}$ atoms per cm$^3$ and having a thickness $7\lambda/4$. Layers 65, 66 and 67 form stack 68. Formed on layer 67 is layer 69 having a thickness of 90.2 nanometers and being of an undoped material $In_{0.48}(Al_{0.7}Ga_{0.3})_{0.52}P$. A 6 nanometer layer 70 constituting undoped $In_{0.54}Ga_{0.46}P$ material is formed on layer 69. On layer 70 is a 7 nanometer layer 71 of undoped $In_{0.48}(Al_{0.7}Ga_{0.3})_{0.52}P$. On that layer 71 is formed a layer 70. Layer 71 is formed on layer 70, and on layer 71 is formed layer 70, and finally on layer 70 is formed a layer 72. All layers 70 have the same thicknesses and constitute the same material and all layers 71 have the same thicknesses and constitute the same material. Layer 72 has a thickness of 54.8 nanometers and is undoped $In_{0.48}(Al_{0.7}Ga_{0.3})_{0.52}P$. Layers 69, 70, 71 and 72 form stack 73. Stack 73 has a thickness of $5\lambda/4$ for a laser wavelength of 650 nanometers.

$5\lambda/4 = \Sigma_i(layer_i\ thickness \bullet refractive\ index_i)$, where i designates each individual layer.

Formed on layer 72 of stack 73 is layer 74 having a thickness of 53.1 nanometers ($\lambda/4$) of n-doped AlAs having a doping concentration of $1 \times 10^{18}$ atoms per cm$^3$. On layer 74 is formed a layer 75 having a thickness of 46.8 nanometers ($\lambda/4$) of n-doped $Al_{0.5}Ga_{0.5}As$ having a doping concentration of $1 \times 10^{18}$ atoms per cm$^3$. This pair of layers 74 and 75 is repeated 28 times. On the most recently formed layer 75 is formed a layer 76 having a thickness of 53.1 nanometers ($\lambda/4$) of n-doped AlAs having a doping concentration of $1 \times 10^{18}$ atoms per cm$^3$. On layer 76 is formed layer 77 having a thickness of 46.8 nanometers ($\lambda/4$) of n-doped n-doped $Al_{0.50}Ga_{0.50}As$ having a doping concentration of $>1 \times 10^{19}$ atoms per cm$^3$. Layers 74, 75, 76 and 77 form stack 78 which is situated on stack 73. Stacks 78 and 73 are etched to form a mesa on layer 67. Layers 65, 66 and 67, which form stack 68, are etched to form a mesa on layer 64. On the surface of layer 64 on both sides of the mesa of stack 68, is formed an n-ohmic contact 79 and an n-ohmic contact 80. On the surface of layer 67 on each side of stack 73 is formed a p-ohmic contact 81 and a p-ohmic contact 82. On surface 17 of layer 77 are formed an n-ohmic contact 83 and an n-ohmic contact 84. For the functioning of laser 13 and photo conducting detector 12, a +5 volt potential is applied to contact 79 and a +3 volt potential is applied to contact 80, a ground or zero voltage reference is applied to contacts 81 and 82, and a −3 to −5 volt potential is supplied to contacts 83 and 84 of embodiment 85 in FIG. 4.

FIG. 5 shows embodiment 90 of laser 13 integrated with a photo conducting detector 12, for emission at 980 nanometers. Layer 86 has a thickness of 1000 nanometers and is of n-doped $In_{0.185}Ga_{0.815}As$ having a doping concentration from $5 \times 10^{17}$ to $1 \times 10^{18}$ atoms per cm$^3$. Layer 86 is formed on semi-conducting or n+GaAs substrate 31. On layer 86 is formed a layer having $\lambda/4$ thickness of undoped GaAs material. Formed on layer 87 is layer 88 having a thickness of $\lambda/4$ of undoped AlAs material. The pair of layers 87 and 88 is repeated and stacked on top of one another 25 times. On top of the last applied layer of the pairs, layer 88, is a layer 89 having a thickness of 7 $\lambda/4$ of p-doped GaAs having a doping concentration of $2 \times 10^{18}$ atoms per cm$^3$. Layers 87, 88 and 89 form stack 91.

Formed on layer 89 is a layer 92 having a "y" thickness of undoped $Al_{0.50}Ga_{0.50}As$ material. Formed on layer 92 is layer 93 having a thickness of 8 nanometers of undoped $In_{0.185}Ga_{0.815}As$. On layer 93 is a layer 94 of 8 nanometers of undoped GaAs material. Formed on the latter layer 94 is layer 93 having 8 nanometers of undoped $In_{0.185}Ga_{0.815}As$ material. On the latter layer 93 is a layer 94 having a thickness of 8 nanometers of undoped GaAs material. On the latter layer 94 is formed layer 93 having a thickness of 8 nanometers of undoped $In_{0.185}Ga_{0.815}As$ material. On the latter layer 93 is layer 95 having a thickness "x" of undoped $Al_{0.50}Ga_{0.50}As$ material. Layers 92, 93 and 95 form stack 96.

Formed on layer 95 is layer 97 having a thickness of $\lambda/4$ of n-doped AlAs having a doping concentration of $1 \times 10^{18}$ atoms per cm$^3$. Formed on layer 97 is layer 98 having a $\lambda/4$ of n-doped GaAs having a doping concentration of $1 \times 10^{18}$ atoms per cm$^3$. Pair of layers 97 and 98 is repeated 17 times on one another. On the latter layer 98 is formed a layer 99 having a thickness of $\lambda/4$ of n-doped AlAs having a doping concentration of $1 \times 10^{18}$ atoms per cm$^3$. On layer 99 is formed layer 101 having a thickness of $\lambda/4$ of n-doped GaAs having a doping concentration of $>1 \times 10^{19}$ atoms per cm$^3$. Layers 97, 98, 99 and 101 form stack 102.

Stacks 102 and 96 are etched as a mesa situated on layer 89. Stack 91 is etched as a mesa situated on layer 86. On the surface of layer 86 on both sides of mesa 91 are n-ohmic contact 103 and n-ohmic contact 104. On the surface of layer 89 on both sides of stack 96 are p-ohmic contact 105 and p-ohmic contact 106, respectively. On surface 17 of layer 101 are n-ohmic contact 107 and n-ohmic contact 108. For the functioning of the embodiment 90, +5 volts is applied to contact 103 and +3 volts is applied to contact 104. A ground or reference voltage of zero volts is applied to contacts 105 and 106. A minus voltage from −3 to −5 volts is applied to contacts 107 and 108.

FIG. 6 shows laser 13 emitting at 850 nanometers, incorporating a photo conducting detector 12, with the junction flipped over. On semi-insulating or n+GaAs substrate 31 is layer 109 having a thickness of 1000 nanometers of p-doped GaAs having a doping concentration of $1 \times 10^{18}$ to $2 \times 10^{18}$ atoms per cm$^3$. Formed on layer 109 is layer 110 having a thickness of 60.5 nanometers ($\lambda/4$) of undoped $Al_{0.15}Ga_{0.85}As$ material. Layer 111 is formed on layer 110, wherein layer 111 has a thickness of 71.1 nanometers ($\lambda/4$) of undoped AlAs material. The pair of layers 110 and 111 is repeated 25 times. On the last formed layer 111, layer 112 having a thickness of 423.5 nanometers ($7\lambda/4$) of n-doped $Al_{0.15}Ga_{0.85}As$ having a doping concentration of $2 \times 10^{18}$ atoms per cm$^3$ is formed. Layers 110, 111 and 112 constitute stack 135.

Layer 113 having a thickness of 162.8 nanometers of undoped $Al_{0.25}Ga_{0.75}As$ is formed on layer 112. On layer 113 is formed layer 114 of 8 nanometers of thickness of undoped GaAs material. On layer 114 is formed layer 115 having a thickness of 10 nanometers of undoped $Al_{0.25}Ga_{0.75}As$ material. On layer 115 is formed layer 116 having a thickness of 8 nanometers of undoped GaAs material. Formed on layer 116 is layer 117 having a thickness of 10 nanometers of undoped $Al_{0.25}Ga_{0.75}As$ material.

On layer 117 is layer 118 having a thickness of 8 nanometers of undoped GaAs material. On layer 118 is layer 119 having a thickness of 100.9 nanometers of undoped $Al_{0.25}Ga_{0.75}As$ material. Layers 113–119 constitute stack 120.

Formed on layer 119 is layer 121 having a thickness of 71.1 nanometers ($\lambda/4$) of p-doped AlAs material having a concentration of $1\times10^{18}$ atoms per $cm^3$. On layer 121 is layer 122 having a thickness of 60.5 nanometers ($\lambda/4$) of p-doped $Al_{0.15}Ga_{0.85}As$ having a concentration of $1\times10^{18}$ atoms per $cm^3$. The pair of layers 121 and 122 is repeated 17 times. On the last formed layer 122 is formed layer 123 having a thickness of 71.1 nanometers ($\lambda/4$) of p-doped AlAs material having a concentration of $1\times10^{18}$ atoms per $cm^3$. On layer 123 is formed a layer 124 having a thickness of 60.5 nanometers ($\lambda/4$) of p-doped $Al_{0.15}Ga_{0.85}As$ having a concentration of $>1\times10^{19}$ atoms per $cm^3$. Layers 121, 122, 123 and 124 constitute stack 125.

Stacks 120 and 125 are etched down as a mesa on layer 112. Stack 135 is etched down as a mesa on layer 109. On layer 109 p-ohmic contacts 126 and 127 are formed on surface of layer 109. N-ohmic contacts 128 and 129 are formed on surface of layer 112. P-ohmic contacts 130 and 131 are formed surface 17 of layer 124. For the functioning of embodiment 100, −5 volts is applied to contact 126 and −3 volts is applied to contact 127. A ground or zero voltage reference is applied to contacts and 129. A voltage ranging from +3 to +5 volts is applied to contacts 130 and 131.

I claim:

1. An integrated laser power monitor comprising:
    a substrate;
    a photo detector formed on said substrate; and
    a laser source having a first end formed on said photo detector and having a second end for the emission of light; and
    wherein:
    if said laser source is emitting light from the second end, then some light is leaked from the first end which is detected by said photo detector for indicating an amount of power of light emitted from the second end;
    said substrate is a layer of semi-insulating GaAs;
    said photo detector comprises a layer of GaAs; and
    said laser source comprises:
        a first mirror, at the first end of said source, formed on said photo detector, having a stack of alternating $Al_xGa_{1-x}As$ and AlAs layers;
        a cavity, formed on said first mirror, having a stack of alternating $Al_xGa_{1-x}As$ and GaAs layers; and
        a second mirror, at the second end of said source, formed on said cavity, having a stack of alternating AlAs and $Al_xGa_{1-x}As$ layers.

2. The integrated laser power monitor of claim 1 wherein said laser source is a vertical cavity surface emitting laser.

3. An integrated laser power monitor comprising:
    a substrate;
    a photo detector formed on said substrate; and
    a laser source having a first end formed on said photo detector and having a second end for the emission of light; and
    wherein:
    if said laser source is emitting light from the second end, then some light is leaked from the first end which is detected by said photo detector for indicating an amount of power of light emitted from the second end;
    said substrate is semi-insulating GaAs;
    said photo detector comprises a layer of GaAs; and
    said laser source comprises:
        a first mirror, at the first end of said source, formed on said photo detector, having a stack of alternating $Al_xGa_{1-x}As$ and AlAs layers;
        a cavity, formed on said first mirror, having a stack of alternating $In_x(Al_yGa_{1-y})_{1-x}P$ and $In_zGa_{1-z}$ layers; and
        a second mirror, at the second end of said source, formed on said cavity, having a stack of alternating AlAs and $Al_xGa_{1-x}As$ layers.

4. The integrated laser power monitor of claim 3 wherein said laser source is a vertical cavity surface emitting laser.

5. An integrated laser power monitor comprising:
    a substrate;
    a photo detector formed on said substrate; and
    a laser source having a first end formed on said photo detector and having a second end for the emission of light; and
    wherein:
    if said laser source is emitting light from the second end, then some light is leaked from the first end which is detected by said photo detector for indicating an amount of power of light emitted from the second end;
    said substrate is semi-insulating GaAs;
    said photo detector comprises a layer of $In_xGa_{1-x}As$; and
    said laser source comprises:
        a first mirror, at the first end of said source, formed on said photo detector, having a stack of alternating GaAs and AlAs layers;
        a cavity, formed on said first mirror, having a stack of alternating $Al_xGa_{1-x}As$ and $In_yGa_{1-y}As$ layers; and
        a second mirror, at the second end of said source, formed on said cavity, having a stack of alternating AlAs and GaAs layers.

6. The integrated power monitor of claim 5 wherein said laser source is a vertical cavity surface emitting laser.

* * * * *